United States Patent [19]

Tabata et al.

[11] Patent Number: 5,748,997
[45] Date of Patent: May 5, 1998

[54] CONTROL METHOD OF A ZOOM LENS CAMERA

[75] Inventors: Yasushi Tabata; Norio Numako; Yoshinari Tanimura; Takuma Sato; Masaaki Kishimoto; Hiroshi Nomura; Kazuyoshi Azegami; Takamitsu Sasaki, all of Tokyo, Japan

[73] Assignee: Asahi Kogaku Kogyo Kabushiki Kaisha, Tokyo, Japan

[21] Appl. No.: 781,603

[22] Filed: Jan. 9, 1997

[30] Foreign Application Priority Data

Jan. 26, 1996 [JP] Japan ................... 8-012317
Feb. 21, 1996 [JP] Japan ................... 8-034121

[51] Int. Cl.⁶ .......................................... G03B 17/00
[52] U.S. Cl. .................... 396/87; 396/72; 396/79; 396/85; 359/696
[58] Field of Search ................... 396/72, 76, 79, 396/85, 86, 87, 82; 359/698, 696, 697

[56] References Cited

U.S. PATENT DOCUMENTS 4,936,664  6/1990  Haraguchi et al. .
5,173,807  12/1992  Kaneda et al. .................... 396/86
5,189,559  2/1993  Kaneko ............................ 396/86
5,276,318  1/1994  Hirasawa .
5,392,159  2/1995  Sasaki et al. .................... 396/79

FOREIGN PATENT DOCUMENTS 7-172216  7/1995  Japan .

OTHER PUBLICATIONS

United Kingdom Serach Report.

Primary Examiner—Russell E. Adams
Attorney, Agent, or Firm—Greenblum & Bernstein P.L.C.

[57] ABSTRACT

A control method of a zoom lens camera comprising a lens system having a movable front lens group and a movable rear lens group, a first motor for moving the front lens group, a second motor for moving the rear lens group, a first pulse encoder which is adapted to control the angular position of the first motor and a second pulse encoder which is adapted to control the angular position of the second motor. In such a zoom lens camera, the difference in the image plane position between the wide-angle position and the telephoto position is measured to obtain the necessary number of drive pulses for the motors, so that the zoom adjustment and the fB adjustment can be carried out without need of a mechanical zoom adjustment or a mechanical fB adjustment.

4 Claims, 3 Drawing Sheets

CONTROL METHOD OF A ZOOM LENS CAMERA

BACKGROUND OF THE INVENTION

1. Field of the Invention

The present invention relates to a control method of a zoom lens camera, and more precisely relates to a method for controlling a back focus in relation with a zoom adjustment in a zoom lens camera.

2. Description of the Related Art

In a conventional zoom lens camera, a zoom adjustment to prevent the position of an image plane from being moved during a zooming operation, and a back focus adjustment (fB adjustment) to make the image plane coincident with a focal plane of the camera, are required. In general, the zoom adjustment is carried out by mechanically moving the lenses to make the image plane positions at a telephoto extremity and a wide-angle extremity identical.

SUMMARY OF THE INVENTION

It is an object of the present invention to provide a control method of a zoom lens camera in which neither a mechanical zoom adjustment nor a mechanical fB adjustment is necessary.

The present invention is essentially applied to a zoom lens camera consisting of a lens system having a movable front lens group and a movable rear lens group, a first motor for moving the front lens group, a second motor for moving the rear lens group, a first pulse encoder which is adapted to control the angular position of the first motor and a second pulse encoder which is adapted to control the angular position of the second motor. In such a zoom lens camera, according to the present invention, the difference in the image plane position between the wide-angle position and the telephoto position is measured to obtain the necessary number of drive pulses for the motors, so that the zoom adjustment and the fB adjustment can be carried out without the need for a mechanical zoom adjustment or a mechanical fB adjustment.

According to the present invention, there is provided control method of a zoom lens camera consisting of a lens system having a movable front lens group and a movable rear lens group, a first motor for moving the front lens group, a second motor for moving the rear lens group, a first pulse encoder which is adapted to control the angular position of the first motor and a second pulse encoder which is adapted to control the angular position of the second motor. The method includes a first step of measuring the positions of an image plane at a wide-angle position and a telephoto position to determine the difference therebetween in the optical axis direction; a second step of obtaining the displacement of the front lens group necessary to make identical the positions of the image plane at the wide-angle position and the telephoto position without moving the rear lens group to thereby determine a number of drive pulses of the first motor necessary to move the front lens group through the displacement thus obtained; a third step of obtaining displacements of the front lens group and the rear lens group necessary to make the position of the image plane when the movement of the front lens group by said displacement obtained in the second step takes place coincident with the focal plane of the camera to thereby determine a number of drive pulses of the first and second motors necessary to move the front lens group and the rear lens group through the respective displacements thus obtained; and a fourth step of controlling the first and second motors upon focusing, through the respective pulse encoder, in accordance with the number of drive pulses obtained at the second step, the number of drive pulses obtained at the third step, the number of drive pulses based on focal length information, and the number of drive pulses based on object distance information.

The present invention is also applied to a zoom lens camera consisting of a lens system having a movable front lens group and a movable rear lens group, a whole unit driving motor which is adapted to move the front lens group and the rear lens group together, a rear lens group driving motor which is adapted to move the rear lens group relative to the front lens group, and a pair of pulse encoders which are adapted to control the angular position of the whole unit driving motor and rear lens group driving motor.

According to the present invention, the method includes a first step of measuring the positions of an image plane at a wide-angle position and a telephoto position to determine the difference therebetween in the optical axial direction; a second step of obtaining the displacement of the front lens group necessary to make identical the positions of the image plane at the wide-angle position and the telephoto position without moving the rear lens group to thereby determine a number of drive pulses of the whole unit driving motor and the rear lens group driving motor necessary to move the front lens group through the displacement thus obtained without moving the rear lens group; a third step of obtaining displacements of the front lens group and the rear lens group necessary to make the position of the image plane when the movement of the front lens group by said displacement obtained in the second step takes place coincident with the focal plane of the camera to thereby determine a number of drive pulses of the whole unit driving motor and the rear lens group driving motor necessary to move the front lens group and the rear lens group through the respective displacements thus obtained; and a fourth step of controlling the whole unit driving motor and the rear lens group driving motor upon focusing, through the respective pulse encoder, in accordance with the number of drive pulses obtained at the second step, the number of drive pulses obtained at the third step, the number of drive pulses based on focal length information, and the number of drive pulses based on object distance information.

The present disclosure relates to subject matter contained in Japanese Patent Application Nos. 8-12317 (filed on Jan. 26, 1996) and 8-34121 (filed on Feb. 21, 1996) which are expressly incorporated herein by reference in their entireties.

BRIEF DESCRIPTION OF THE DRAWINGS

The invention will be described below in detail with reference to the attached drawings, in which.

DESCRIPTION OF THE PREFERRED EMBODIMENT

Figure 1:
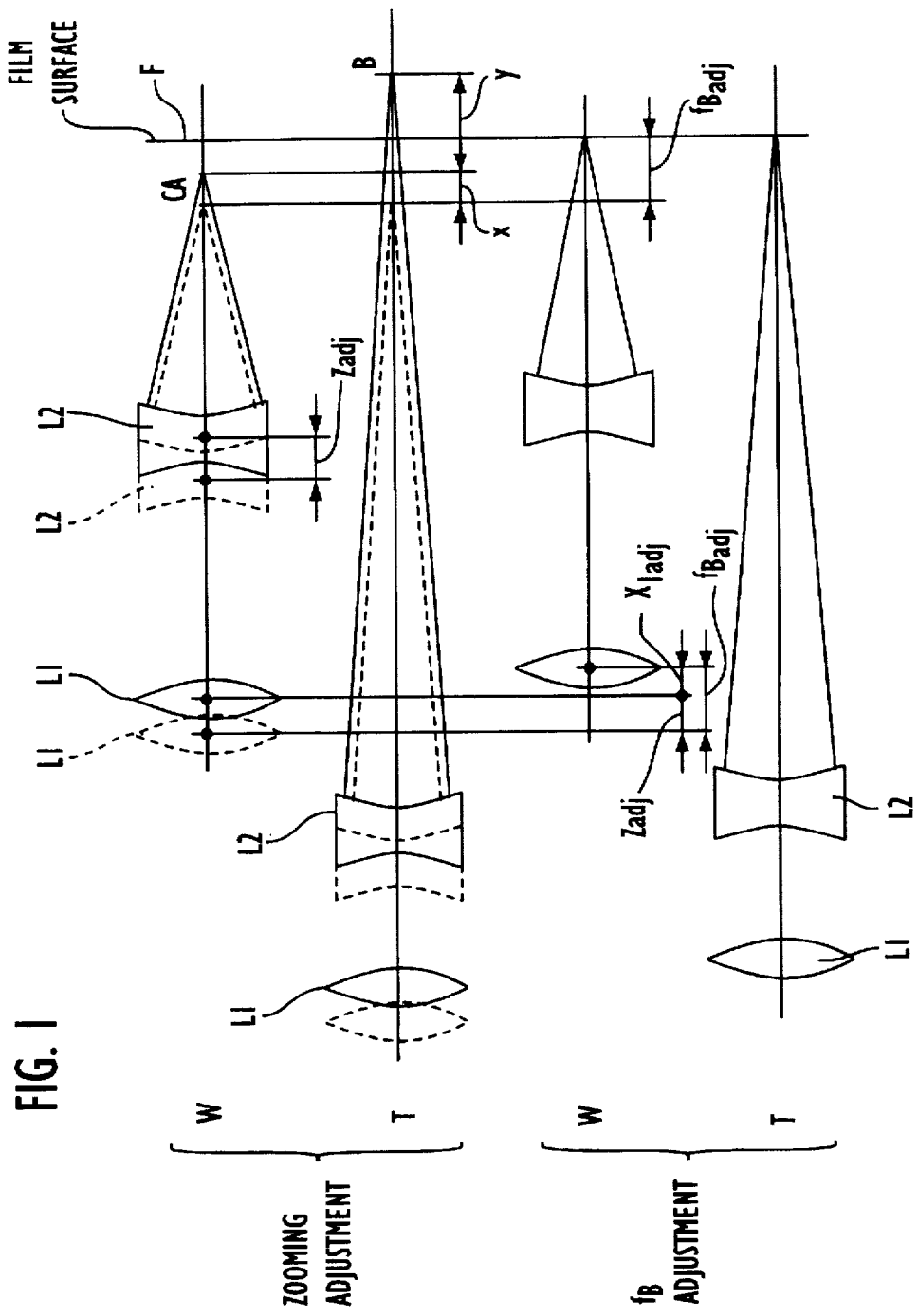
FIG. 1 is a schematic view showing the principle of a control method of a zoom lens camera according to the present invention.

FIG. 1 shows the principle of the control method of a zoom lens camera according to the present invention. A zoom lens camera comprises a lens system having movable front and rear lens groups L1 and L2, a whole unit driving motor which moves the front and rear lens groups together, a rear lens group driving motor which moves the rear lens group relative to the front lens group, and a pair of pulse encoders which control the angular position of the motors are provided with an imaginary front lens group focusing system in which the front lens group L1 and the rear lens group L2 are advanced by the whole unit driving motor as shown by dotted lines in FIG. 1, and the rear lens group L2 is moved backward through the same displacement as the advancement by the rear lens group driving motor (i.e., no change in the position of the rear lens group occurs) to carry out the focusing operation. That is, the rear lens group L2 stays at a position shown by solid lines in FIG. 1.

On the assumption that the difference between the image planes at a telephoto extremity and at a wide-angle extremity is "y", the difference "y" is eliminated by moving the front lens group L1 by a displacement $Z_{adj}$ without moving the rear lens group L2 during the zooming operation. The position of the image plane at the telephoto extremity is made coincident with that at the wide-angle extremity by the zoom adjustment, but the image plane position after the zoom adjustment is complete is not identical to the position F of the focal plane (rail surface) of the camera. Assuming that the displacement of the image plane at the wide-angle extremity when the zoom adjustment is completed is "x", and the displacement necessary to make the image plane coincident with the focal plane F is $fB_{adj}$, the following relationships are established:

$$x = y \cdot [1/\{(K_1W/K_1T)-1\}]$$

$$Z_{adj} = x/K_1W$$

$$X_{1adj} = fB_{adj} - Z_{adj}$$

wherein $K_1W$ represents the focusing sensitivity of the front lens group at the wide-angle extremity, $K_1T$ represents the focusing sensitivity of the front lens group at the telephoto extremity, and $X_{1adj}$ represents a difference between $fB_{adj}$ and $Z_{adj}$ of the front lens group L1.

As can be understood from the above-mentioned analysis, "y" is determined in accordance with the detection of the positions "A" and "B" of the image plane relative to the focal plane (rail surface), and then the position C is determined in accordance with the value of "x" which is obtained by calculation. In a zoom lens camera to which the present invention is applied, the position of the front lens group and the rear lens group in the optical axis direction is controlled by two motors and the respective pulse encoder. To this end, the values of $Z_{adj}$, $fB_{adj}$ and $X_{1adj}$ which are obtained in accordance with the measurement of "y", are respectively converted into pulses which are added to the number of pulses representing focal length information and subject distance information to thereby control the positions of the lens groups upon focusing. Thus, neither a mechanical zoom adjustment nor a mechanical fB adjustment are necessary.

Embodiments of the present invention will be discussed below.

The assignee of the present application has proposed a novel zoom lens camera which comprises a lens system having at least a movable front lens group on the object side and a movable rear lens group on the focal plane side, a whole unit driving motor which is adapted to move the front lens group and the rear lens group together, a relative movement driving motor which is adapted to relatively move the front lens group or rear lens group to vary the distance therebetween, a zoom operating means which is adapted to set the focal length of the lens system, and a focus operating means (Japanese Patent Application No. 7-172216). In this zoom lens camera, both the whole unit driving motor and the relative movement driving motor are moved to bring the object into a focused state when the focus operating means is actuated within at least a certain focal length range which is set by the zoom operating means.

Figure 2:
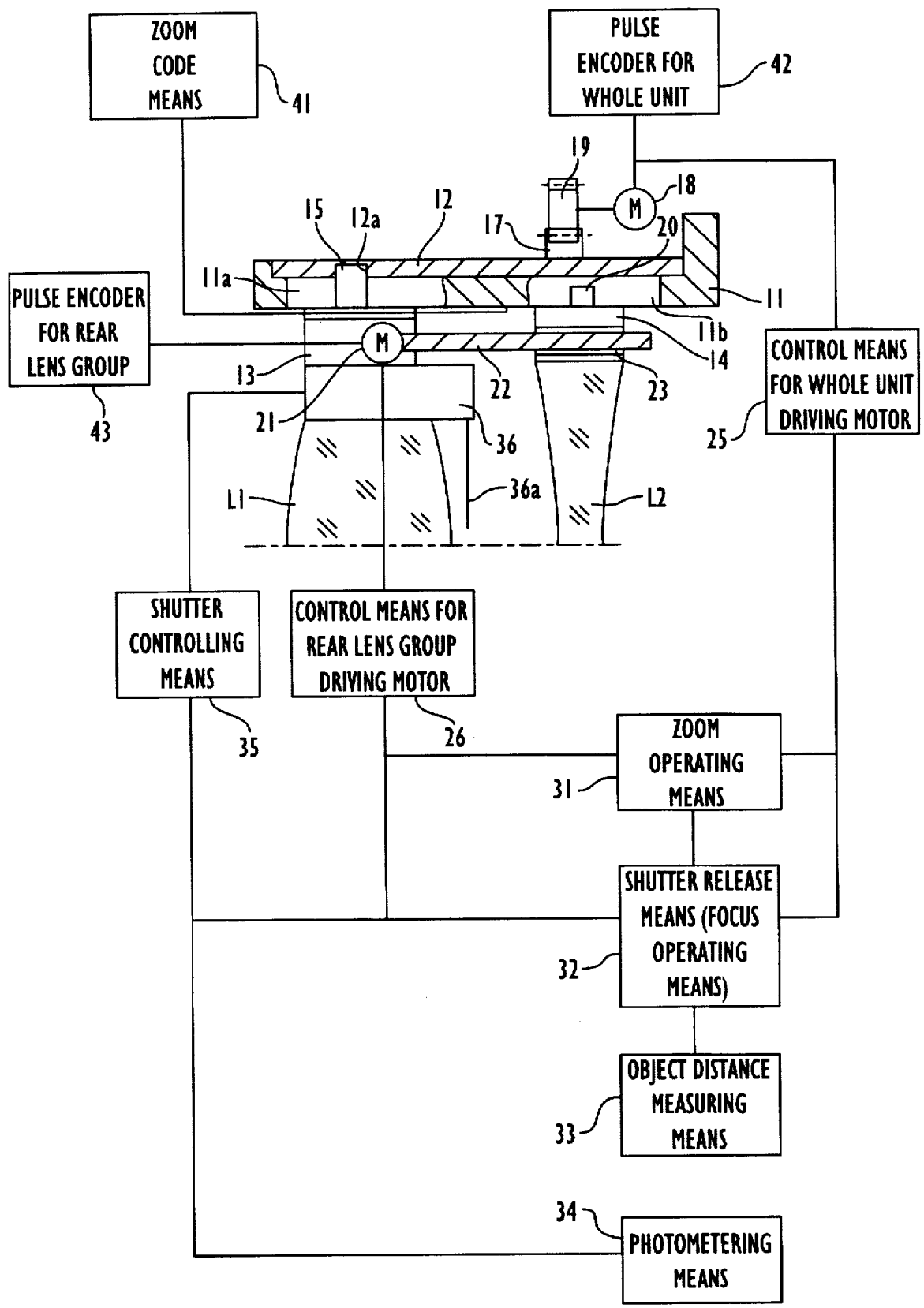
FIG. 2 is a conceptual view of a zoom lens camera to which the present invention is applied.
Figure 3:
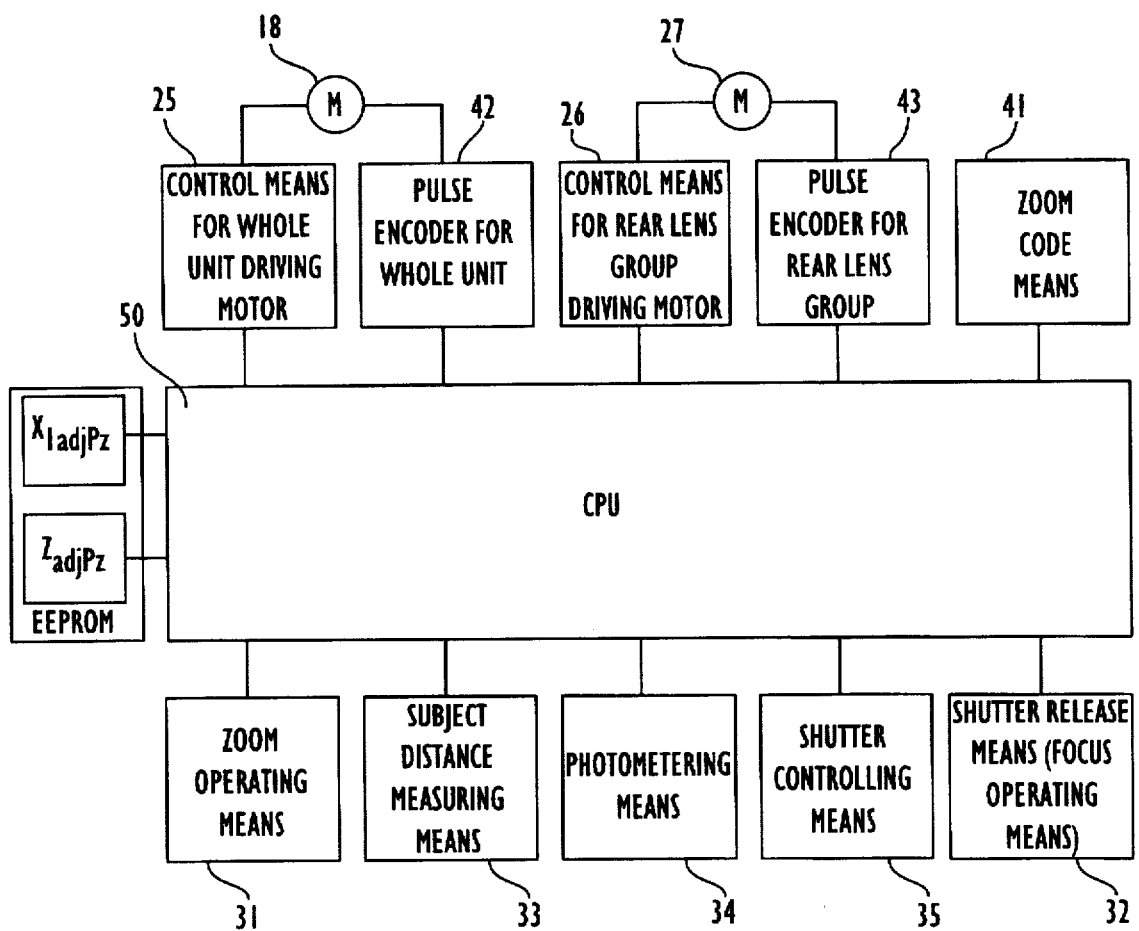
FIG. 3 is a block diagram of a control system shown in FIG. 2.

In FIGS. 2 and 3 which show an embodiment of the present invention, a zoom lens is provided with a front lens group L1 of positive power and a rear lens group L2 of negative power. On an outer periphery of a stationary ring 11 of the lens barrel, a driving ring 12 is rotatively supported, and on an inner periphery thereof, a front lens group supporting ring 13, which supports the front lens group L1, and a rear lens group supporting ring 14, which supports the rear lens group L2, are engaged. On the stationary ring 11, a linear guide groove 11a is formed parallel to an optical axis of the zoom lens barrel, and a radial pin 15, provided on the front lens group supporting ring 13 and extending through the linear guide groove 11a, is engaged in a lead groove 12a formed on an inner peripheral surface of the driving ring 12. On an outer periphery of the driving ring 12, a gear 17 is fixedly engaged with a gear 19 of a whole unit driving motor 18.

On the stationary ring 11, a linear guide groove 11b for the rear lens group is formed parallel to the optical axis of the zoom lens barrel. A radial pin 20, provided on the rear lens group supporting ring 14, engages with the linear guide groove 11b. On the front lens group supporting ring 13, a rear lens group driving motor 21 and a driving screw 22 driven rotatively by the rear lens group driving motor 21, are provided. The driving screw 22 engages with an anti-rotating nut 23 provided on the rear lens group supporting ring 14.

In the above described structural arrangement, when the driving ring 12 is rotatively driven by the whole unit driving motor 18, in accordance with the relationship between the lead groove 12a and the linear guide groove 11a, the front lens group supporting ring 13 (i.e., the front lens group L1) moves in the optical axis direction. Since the rear lens group supporting ring 14 (i.e., the rear lens group L2) is connected to the front lens group supporting ring 13 through the driving screw 22 and the nut 23, the rear lens group supporting ring 14 moves together with the front lens group supporting ring 13 in the optical axis direction. Thus it can be understood that the whole unit driving motor 18 moves both the lens groups, i.e., the front and rear lens groups, together as a whole.

On the other hand, when the driving screw 22 is rotatively driven by the rear lens group driving motor 21, the rear lens group supporting ring 14 (i.e., the rear lens group L2) moves relative to the front lens group supporting ring 13 (i.e., the front lens group L1). Thus it can be understood that the rear lens group driving motor 21 is a motor which varies the distance between the rear lens group L2 and the front lens group L1.

The whole unit driving motor 18 and the rear lens group driving motor 21 are respectively controlled and driven by respective motor controlling means 25 and 26.

The displacement of the whole lens group unit is detected by a zoom code means 41 provided between the stationary ring 11 and the front lens group supporting ring 13, and a pulse encoder 42 for the whole unit, which controls the angular position of the whole unit driving motor 18. The zoom code means 41 detects the whole focal length as finite focal length information. The position of the rear lens group L2 relative to the front lens group supporting ring 13 (front lens group L1) is controlled by a pulse encoder 43 for the rear lens group. The pulse encoder 43 includes a means (switch) for determining a reference position of the rear lens group L2 relative to the front lens group L1.

In the main body of the camera, a zoom operating means 31, a focus operating means (shutter release means) 32, an object distance measuring device (object distance measuring means) 33 and a photometering means 34 are provided. The zoom operating means 31 provides a zooming command, namely commands to move from a "wide" position to a "tele" position, or vice versa, to the zoom lens consisting of the front lens group L1 and the rear lens group L2. The zoom operating means 31 consists of, for example, a switch according to a momentary mechanical system. The shutter release means 32 consists of, for example, a release button. When the release button is depressed by a half-depression (half-step), an object distance measuring command is input to the object distance measuring device 33 and a photometering command is input to the photometering means 34. When the release button is fully depressed (full step), a shutter 36, mounted to the front lens group supporting ring 13, is operated via a shutter controlling means 35. The shutter 36 opens a plurality of shutter blades 36a for a predetermined time according to the photometering information output from the photometering means 34.

In the zoom lens camera as above described, when the zoom operating means 31 is operated, at least the whole unit driving motor 18 is driven via the motor controlling means 25, and the front lens group L1 and the rear lens group L2 are moved as a whole. The rear lens group driving motor 21 may also be driven via the motor controlling means 26 at this time. With the above structural arrangement, it should be understood that the movement of the front lens group L1 and the rear lens group L2 by the zoom operating means 31 is not operated under the conventional concept of zooming in which the focal point does not move. Namely, when the zoom operating means 31 is operated, the following two modes are available, namely:

1. a mode to move the front lens group L1 and the rear lens group L2 in the optical axis direction without varying the distance therebetween, by driving only the whole unit driving motor 18; and, 2. a mode to move the front lens group L1 and the rear lens group L2 in the optical axis direction while varying the distance therebetween, by driving both the whole unit driving motor 18 and the rear lens group driving motor 21.

In mode 1, during the zooming operation it is impossible to always focus on a specific subject. However, this is not a problem in a zoom compact camera, since the image is not observed through the photographing optical system, and it is sufficient to only be focused when the shutter is released. In mode 2, during the zooming operation, the front lens group L1 and the rear lens group L2 are moved so that the focal point of the subject at a specific distance, determined by the front and rear lens groups L1 and L2 is varied, and when the shutter is released, focusing (focus adjusting) is carried out by moving both the whole unit driving means and the rear lens group driving means.

Namely, in the zoom lens camera as constructed above, when the shutter release means 32 is operated in at least one part of the focal length range set by the zoom operating means 31, the whole unit driving motor 18 and the rear lens group driving motor 21 are driven and subject focusing is performed. The movement of the front lens group L1 and the rear lens group L2 by the whole unit driving motor 18 and the rear lens group driving motor 21 is determined, using not only subject distance information provided by the object distance measuring device 33, but also focal length information set by the zoom operating means 31. In such a manner, when the shutter release means 32 is operated, by moving both the whole unit driving motor 18 and the rear lens group driving motor 21, the position of the lenses can be flexibly controlled.

In theory, during an operation of the zoom operating means 31, the magnification of the finder and the focal length information only are varied without driving both the whole unit driving motor 18 and the rear lens group driving motor 21, and when the focus operating means 32 is operated, both the whole unit driving motor 18 and the rear lens group driving motor 21 are moved simultaneously according to the focal length information and the subject distance information obtained by the object distance measuring device 33 to move the front lens group L1 and the rear lens group L2 to positions specifically determined according to the focal length and subject distance information.

In the zoom lens camera as constructed above according to the present invention, the number of drive pulses for the whole unit driving motor 18 and the number of drive pulses for the rear lens group driving motor 21 are calculated taking into account the values of $Z_{adj}$, $fB_{adj}$ and $X_{1adj}$ ($=fB_{adj}-Z_{adj}$), as mentioned above.

The drive pulses $ZP_z$ and $AFP_z$ for the whole unit driving motor 18 and the rear lens group driving motor 21 respectively when the focus operating means 32 is actuated are given by the following relationships:

$$ZP_z = aP_z + bP_z + X_{1adj}P_z + cP_z$$

$$AFP_F = dAFP_F + eAFP_F + Z_{adj}P_F + fAFP_F$$

wherein $aP_z$ represents the number of drive pulses counted after the zoom code means has detected the code edge, $bP_z$ represents the number of zoom pulses corresponding to the subject distance, $X_{1adj}P_z$ represents the number of pulses necessary to advance the front lens group L1 by the value of $X_{1adj}$, $cP_z$ represents the number of pulses necessary for a fine adjustment of the whole unit driving motor 18, $dAFP_F$ represents the fixed number of the drive pulses, $eAFP_F$ represents the number of pulses corresponding to the focal length detected by the zoom code means and the subject distance information, $Z_{adj}P_F$ represents the number of pulses necessary to advance the front lens group L1 by the value of $Z_{adj}$ by means of the whole unit driving motor 18 and move the rear lens group L2 backward by the value of $Z_{adj}$ by means of the rear lens group driving motor 21 (i.e., no positional change of the rear lens group L2 occurs), and $fAFP_F$ represents the number of pulses for a fine adjustment of the rear lens group driving motor 21.

The values of $X_{1adj}P_z$ and $Z_{adj}P_F$, determined in accordance with the positional difference "y" between the image plane at the wide-angle position ("wide" position) and the image plane at the telephoto position ("tele" position) prior to the zoom adjustment are input and stored to a CPU 50. The other pulse signals, are stored in tables in the CPU 50 so that the above mentioned calculations are executed each time the focusing operation (usually, the photographing operation) is carried out to drive the whole unit driving motor 18 and the rear lens group driving motor 21. Note that $cP_z$ and $fAFP_F$ are pulses necessary for a fine adjustment to correct the difference in the position of the focal plane at each zoom step.

As may be understood from the foregoing, according to the present invention, the positional difference between the image plane at the wide-angle position and the image plane at the telephoto position is detected, and the necessary calculations are effected in accordance with the positional difference thus detected. Consequently, the lenses are correctly driven while being subject to the necessary adjustment upon focusing, without performing a mechanical zoom adjustment or a mechanical fB adjustment.

What is claimed is:

1. A control method of a zoom lens camera comprising a lens system having a movable front lens group and a movable rear lens group, a first motor for moving said front lens group, a second motor for moving said rear lens group, a first pulse encoder adapted to control an angular position of said first motor and a second pulse encoder adapted to control an angular position of said second motor, wherein said method comprises:
  measuring positions of an image plane at a wide-angle position and a telephoto position to determine a difference between image plane positions in an optical axis direction;
  obtaining a displacement of said front lens group in order to make said positions of said image plane at said wide-angle position and at said telephoto position identical without moving said rear lens group and determining a number of drive pulses of said first motor to move said front lens group by said obtained displacement;
  deriving displacements of said front lens group and said rear lens group in order to make a position of said image plane, when said movement of said front lens group by said obtained displacement takes place, coincident with said focal plane of said camera to determine a number of drive pulses of said first and second motors necessary to move said front lens group and said rear lens group through said respective obtained displacements; and
  controlling said first and second motors upon focusing, through said first pulse encoder and said second pulse encoder, respectively, in accordance with said number of drive pulses obtained during said obtaining step, a number of drive pulses obtained during said deriving step, a number of drive pulses based on focal length information, and a number of drive pulses based on object distance information.

2. A control method according to claim 1, wherein said number of drive pulses determined at said obtaining step and said deriving step, respectively, are stored in a memory of a CPU which controls the first motor and the second motor, and wherein upon issuance of a shutter release signal said stored drive pulses are read from said memory.

3. A control method of a zoom lens camera comprising a lens system having a movable front lens group and a movable rear lens group, a whole unit driving motor adapted to move said front lens group and said rear lens group together, a rear lens group driving motor adapted to move said rear lens group relative to said front lens group, and a pair of pulse encoders adapted to control angular positions of said whole unit driving motor and rear lens group driving motor, wherein said method comprises:
  measuring positions of an image plane at a wide-angle position and a telephoto position to determine a difference between positions of said image plane in an optical axis direction;
  obtaining a displacement of said front lens group in order to make said positions of said image plane at said wide-angle position and said telephoto position identical without moving said rear lens group to determine a number of drive pulses of said whole unit driving motor and said rear lens group driving motor in order to move said front lens group through said obtained displacement without moving said rear lens group;
  deriving displacements of said front lens group and said rear lens group in order to make said position of said image plane, when said movement of said front lens group by said obtained displacement obtained takes place, coincident with said focal plane of said camera to determine a number of drive pulses of said whole unit driving motor and said rear lens group driving motor to move said front lens group and said rear lens group through said respective obtained displacements; and
  controlling said whole unit driving motor and said rear lens group driving motor upon focusing, through said first pulse encoder and said second pulse encoder, respectively, in accordance with said number of drive pulses obtained during said obtaining step, said number of drive pulses obtained during said deriving step, a number of drive pulses based on focal length information, and a number of drive pulses based on object distance information.

4. The control method according to claim 3, wherein said number of drive pulses determined at the obtaining step and the deriving step are stored in a memory of a CPU which controls the first motor and the second motor, and wherein upon issuance of a shutter release signal said stored drive pulses are read from said memory.

* * * * *